(12) United States Patent
Yuan et al.

(10) Patent No.: US 11,374,404 B2
(45) Date of Patent: Jun. 28, 2022

(54) LOW-VOLTAGE DC POWER DISTRIBUTION FAST SWITCHING DEVICE

(71) Applicants: State Grid Jiangsu Electric Power Co., Ltd. Research Institute, Jiangsu (CN); State Grid Corporation of China, Beijing (CN); State Grid Jiangsu Electric Power Co., Ltd., Jiangsu (CN); Jiangsu Electric Power Research Institute Co., Ltd., Jiangsu (CN)

(72) Inventors: Yubo Yuan, Jiangsu (CN); Tiankui Sun, Jiangsu (CN); Jinggang Yang, Jiangsu (CN); Xiaodong Yuan, Jiangsu (CN); Lei Gao, Jiangsu (CN); Mingming Shi, Jiangsu (CN); Peng Li, Jiangsu (CN); Wei Su, Jiangsu (CN); Kun Yang, Jiangsu (CN); Xinyao Si, Jiangsu (CN); Jianhua Qin, Jiangsu (CN); Xin Fang, Jiangsu (CN); Xiaolong Xiao, Jiangsu (CN); Ruihuang Liu, Jiangsu (CN); Chenqing Wang, Jiangsu (CN); Jiahao Guo, Jiangsu (CN); Yunlong Jiang, Jiangsu (CN); Shuyi Zhuang, Jiangsu (CN); Qun Li, Jiangsu (CN); Jian Liu, Jiangsu (CN); Shu Chen, Jiangsu (CN)

(73) Assignees: State Grid Jiangsu Electric Power Co., Ltd. Research Institute, Nanjing (CN); State Grid Corporation of China, Beijing (CN); State Grid Jiangsu Electric Power Co., Ltd., Nanjing (CN); Jiangsu Electric Power Research Institute Co., Ltd., Nanjing (CN)

( * ) Notice: Subject to any disclaimer, the term of this patent is extended or adjusted under 35 U.S.C. 154(b) by 0 days.

(21) Appl. No.: 17/059,209

(22) PCT Filed: Aug. 26, 2020

(86) PCT No.: PCT/CN2020/111217
§ 371 (c)(1),
(2) Date: Nov. 26, 2020

(87) PCT Pub. No.: WO2021/109628
PCT Pub. Date: Jun. 10, 2021

(65) Prior Publication Data
US 2021/0376603 A1    Dec. 2, 2021

(30) Foreign Application Priority Data

Dec. 3, 2019   (CN) .......................... 201911218990.5
Jan. 15, 2020   (CN) .......................... 202010042109.7

(51) Int. Cl.
*H02J 1/12*    (2006.01)
(52) U.S. Cl.
CPC ..................................... *H02J 1/12* (2013.01)
(58) Field of Classification Search
CPC ........... H02J 1/12; H03K 17/72; H03K 17/74; H03K 17/0412
See application file for complete search history.

(56) References Cited

U.S. PATENT DOCUMENTS 3,808,452 A * 4/1974 Hutchinson ............. H02J 9/061
307/64

FOREIGN PATENT DOCUMENTS

| CN | 201490752 U | 5/2010 |
|----|-------------|--------|
| CN | 102104274 A | 6/2011 |

(Continued)

*Primary Examiner* — Daniel Cavallari (57) ABSTRACT

Disclosed is a low-voltage DC power distribution fast switching device. The device includes a positive output (Continued)

terminal electrically connected to a positive pole of a load, and no less than two switching circuits connected in parallel with each other; the switching circuit includes a positive input terminal electrically connected to a positive pole of common negative power supplies, a supplementary diode cluster composed of no less than one diode connected in series, and a thyristor connected between the positive input terminal and the positive output terminal; the positive input terminal is electrically connected to an anode of the supplementary diode cluster and an anode of the thyristor, and the positive output terminal is electrically connected to a cathode of the complementary diode cluster and a cathode of the thyristor.

9 Claims, 7 Drawing Sheets

(56) References Cited

FOREIGN PATENT DOCUMENTS

| | | |
|---|---|---|
| CN | 203632284 U | 6/2014 |
| JP | 2016201867 A | 12/2016 |

* cited by examiner

LOW-VOLTAGE DC POWER DISTRIBUTION FAST SWITCHING DEVICE

TECHNICAL FIELD

The disclosure relates to a low-voltage DC power distribution fast switching device, and belongs to the technical field of electrical switches.

BACKGROUND

With the large-scale access of distributed new energy, the characteristics of traditional power distribution systems are gradually changed. The distributed new energy needs AC/DC conversion before being connected to the AC distribution network through, which greatly affects the local comprehensive consumption efficiency of the distributed energy in the traditional AC distribution network. By using the DC power distribution system, it can not only achieve high-efficiency access of distributed energy, but can also improve the power consumption efficiency of the DC loads, thereby improving the overall efficiency of the power distribution system. To provide reliable multiple power supplies for some important DC loads so as to ensure high power supply reliability, a low-voltage power distribution fast switching device is usually required. Since the existing low-voltage power distribution fast switching devices are mostly designed for AC power distribution systems, they are not suitable for DC power distribution systems.

SUMMARY

In view of the shortcomings of the prior art, the present disclosure aims to provide a low-voltage DC power distribution fast switching device, so as to solve the technical problem that the low-voltage power distribution fast switching device in the prior art is not suitable for a DC power distribution system.

To solve the above technical problems, the technical solution adopted by the present disclosure is as follows.

A low-voltage DC power distribution fast switching device, including a positive output terminal electrically connected to a positive pole of a load, and no less than two switching circuits connected in parallel with each other. The switching circuit includes a positive input terminal electrically connected to a positive pole of one of common negative power supplies, a supplementary diode cluster composed of no less than one diode connected in series, and a thyristor connected between the positive input terminal and the positive output terminal; the positive input terminal is electrically connected to the anode of the supplementary diode cluster, and the positive input terminal is electrically connected to the anode of the thyristor, the positive output terminal is electrically connected to the cathode of the complementary diode cluster, and the positive output terminal is electrically connected to the cathode of the thyristor.

Preferably, the switching circuit further includes a current sensor connected in series with the supplementary diode cluster.

Preferably, the device further includes a common diode cluster composed no less than one diode connected in series, the anode of the common diode cluster is electrically connected to the cathodes of the supplementary diode clusters of all switching circuits, and the cathode of the common diode cluster is electrically connected to the positive output terminal.

Preferably, the common diode cluster is connected in series with a current sensor.

Preferably, the device further includes a common negative terminal electrically connected to the negative pole of one of the common negative power supplies and the negative pole of the load, and the common negative terminal is electrically connected to the positive output terminal through a delay circuit.

Preferably, the delay circuit includes a delay capacitor, the negative pole of the delay capacitor is electrically connected to the common negative terminal, and the positive pole of the delay capacitor is electrically connected to the positive output terminal.

Preferably, the delay circuit further includes a discharging diode as well as a charging resistor and a charging diode connected in parallel with the discharging diode electrically connected between the positive pole of the delay capacitor and the positive output terminal. The charging resistor is connected in series with the charging diode. The cathode of the charging diode and the anode of the discharging diode are electrically connected to the positive pole of the delay capacitor, the anode of the charging diode is electrically connected to the positive output terminal through a charging resistor, and the cathode of the discharging diode is electrically connected to the positive output terminal.

Preferably, the forward voltage drop of the complementary diode cluster is inversely proportional to the power supply priority of the common negative power supply connected to the switching circuit where the complementary diode cluster is located.

Preferably, the common negative power supplies are low-voltage DC power supplies with a common negative pole.

Compared with the prior art, the present disclosure has the following beneficial effects. With the forward voltage drop of the complementary diode cluster to clamp the load voltage, it is possible to realize uninterrupted automatic switching among power supplies without the intervention of the control system, and provide reliable power supply for the load. As the power supplies are switched automatically without control, the on-state loss of the supplementary diode cluster is reduced by controlling the conduction of the thyristor. The forward voltage drop of the supplementary diode cluster is adjusted by adjusting the number of diodes connected in series in the supplementary diode cluster of each switching circuit, thereby setting the priority of the power supply connected to each switching circuit.

DETAILED DESCRIPTION

The present disclosure will be further described below in conjunction with the drawings. The following embodiments are only for explaining the technical solutions of the present disclosure more clearly, and cannot be used to limit the protection scope of the present disclosure.

Figure 1:
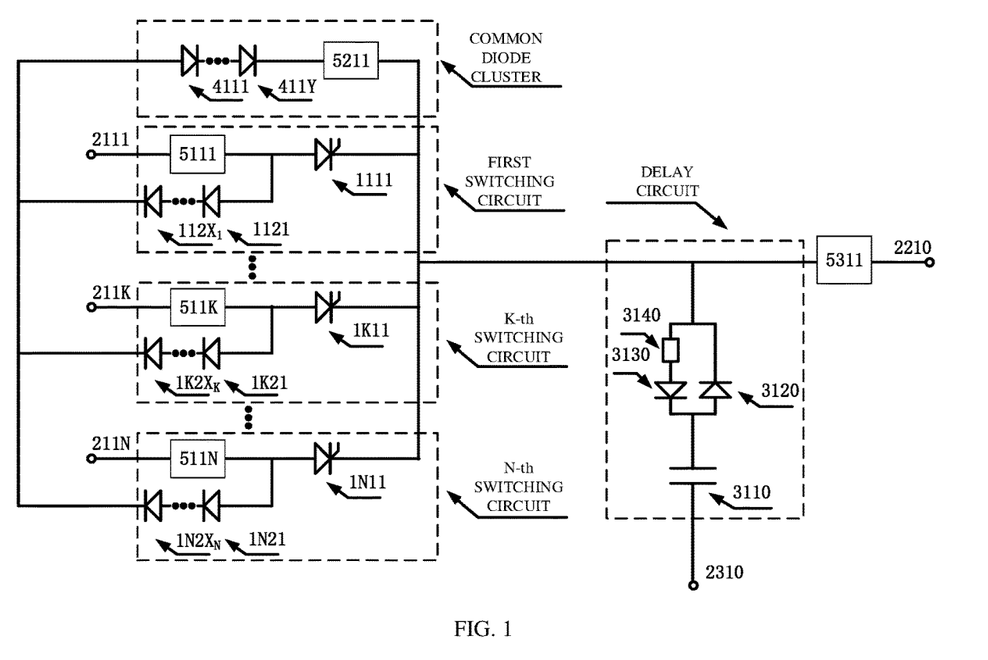
FIG. 1 is a schematic diagram of the electrical topology of the device of the present disclosure.

The specific embodiments of the present disclosure provide a low-voltage DC power distribution fast switching device. The device is suitable for rapid switching among multiway low-voltage DC power supplies having a common negative electrode and the same grounding way. FIG. 1 is the schematic diagram of the electrical topology of the device of present disclosure. The device includes power connection terminals, N-way switching circuits, a common diode cluster, a delay circuit, a current sensor and its auxiliary circuits.

The power connection terminal includes N positive input terminals (a positive input terminal 2111, a positive input terminal 2112, . . . , a positive input terminal 211N), a positive output terminal 2210, and a common negative terminal 2310. The N positive input terminals are correspondingly connected to N-way low-voltage DC power supplies, and any positive input terminal 211K is connected to the K-th power supply. The positive output terminal 2210 is connected to the positive electrode of the load, and the common negative terminal 2310 is connected to the negative electrode of the N-way power supplies and the negative electrode of the load.

N ways of switching circuits are provided in total, which is the same as the number of the aforementioned N-way low-voltage DC power supplies. For a scenario where N-way independent power supplies are used to supply power to a load, the N-way switching circuits of the device of the present disclosure is suitable, and provides for the load the function of fast switching among the N-way power supplies. Any K-th switching circuit includes a thyristor 1K11 and a supplementary diode cluster of $X_K$ diodes (diode 1K21, diode 1K22, . . . , diode $1K2X_K$) connected in series. The anode of the thyristor 1K11 is connected to the positive input terminal 211K, and the cathode of the thyristor 1K11 is connected to the positive output terminal 2210. The anodes and cathodes of the $X_K$ diodes in the complementary diode cluster are connected in sequence, that is, the anode of the diode 1K21 is the anode of the complementary diode cluster, the cathode of the diode 1K21 is connected to the anode of diode 1K22, the cathode of diode 1K22 is connected to the anode of diode 1K23, and so on until the diode $112X_K$, with the cathode of diode $1K2X_K$ serving as the cathode of the complementary diode cluster. The anode of the supplementary diode cluster (the anode of the diode 1K21) is connected to the positive input terminal 211K, and the cathode of the supplementary diode cluster (the cathode of the diode $1K2X_K$) is connected to the anode of the common diode cluster (the anode of the diode 4111).

The common diode cluster is composed of Y diodes with the anodes and cathodes connected in sequence. That is, the anode of the diode 4111 is the anode of the common diode cluster, the cathode of the diode 4111 is connected to the anode of the diode 4112, and the cathode of diode 4112 is connected to the anode of the diode 4113, and so on until the diode 411Y, with the cathode of the diode 411Y serving as the cathode of the common diode cluster. The anode of the common diode cluster (the anode of the diode 4111) is connected respectively to the cathodes of the supplementary diode cluster of the N-way switching circuits (the cathodes of the diode $112X_1$, the diode $112X_2$, . . . , the diode $112X_K$), and the cathode of the common diode cluster is connected to the positive output terminal 2210.

The delay circuit is composed of a charging resistor 3140, a charging diode 3130, a discharging diode 3120 and a delay capacitor 3110. One end of the charging resistor 3140 is connected to the positive output terminal 2210, and the other end of the charging resistor 3140 is connected to the anode of the charging diode 3130. The cathode of the charging diode 3130 is connected to the positive pole of the delay capacitor 3110, and the anode of the discharging diode 3120 is connected to the positive pole of the delay capacitor 3110. The cathode of the discharging diode 3120 is connected to the positive output terminal 2210, and the negative pole of the delay capacitor 3110 is connected to the common negative terminal 2310.

The current sensor includes an output current sensor, a common diode cluster current sensor 5211, and an output current sensor 5311. There is a total of N output current sensors (current sensor 5111, current sensor 5112 . . . , current sensor 511N). Any K-th output current sensor 511K is installed between any positive input terminal 211K and K-th switching circuit for measuring the current flowing from the K-th power supply into the device of the disclosure. The common diode cluster current sensor 5211 is installed on the cathode of the common diode cluster (the cathode of the diode 411Y), and is used to measure the current flowing through the common diode cluster. The output current sensor 5311 is installed in front of the positive output terminal 2210 of the device of the present disclosure, and is used to measure the output current of the device of the present disclosure.

The forward voltage drop of the Y diodes connected in series in the common diode cluster is greater than the set value U1, and U1 is set in consideration of the voltage range under normal operation in the low-voltage DC power quality standard and the voltage variation range of the N-way power supplies.

In any K-th switching circuit, the number $X_K$ of diodes in the supplementary diode cluster is set in consideration of the power supply priority and the voltage quality of the K-th power supply, and $X_K$ is at least one. Assuming that in two switching circuits, the M-th and L-th switching circuits, the power supply priority of the power supply connected to the M-th switching circuit is only one priority higher than that of the power supply of the L-th switching circuit, then the forward voltage drop of the supplementary diode cluster in the L-th switching circuit (i.e., the conduction voltage drop of the $X_L$ diodes) needs to be higher by U2 than the forward voltage drop of the complementary diode cluster in the M-th switching circuit (i.e., the conduction voltage drop of the $X_M$ diodes), and the voltage difference U2 is set with reference to voltage ripple.

Control Method

Assuming that the current measurement of the output current sensor 511K is $I_{511K}$, and the forward direction is from the power supplies to the device of the present disclosure. The current measurement of the current sensor 5211 of the common diode cluster is $I_{5211}$, and the forward direction is from the anode of the common diode cluster to the cathode of the common diode cluster. The current measurement of the output current sensor 5311 is $I_{5311}$, and the forward direction is from the device of the present disclosure to the load.

When any K-th power supply loses power, the current of the thyristor 1K11 in the K-th switching circuit drops to 0 and the thyristor 1K11 is blocked. After the thyristor 1K11 is locked, the current flowing from each power supply is the current in each corresponding complementary diode cluster. Assuming that the power supply with the highest priority except for the K-th power supply in the N-way power supplies is the G-th way, and because the forward voltage drop of the supplementary diode cluster in the G-th switching circuit is the lowest, the current $I_{511G}$ flowing through the supplementary diode cluster in the G-th switching circuit is greater than the current of the supplementary diode clusters in other switching circuits. When $I_{5211}$ is greater than the set value $I_1$, and $I_{511G}$ is greater than the currents of any other power supplies, a turn-on signal is sent to the thyristor 1G11, the thyristor 1G11 is turned on; the power supply G supplies power to the load through the thyristor 1G11 to realize power switching.

Figure 2:
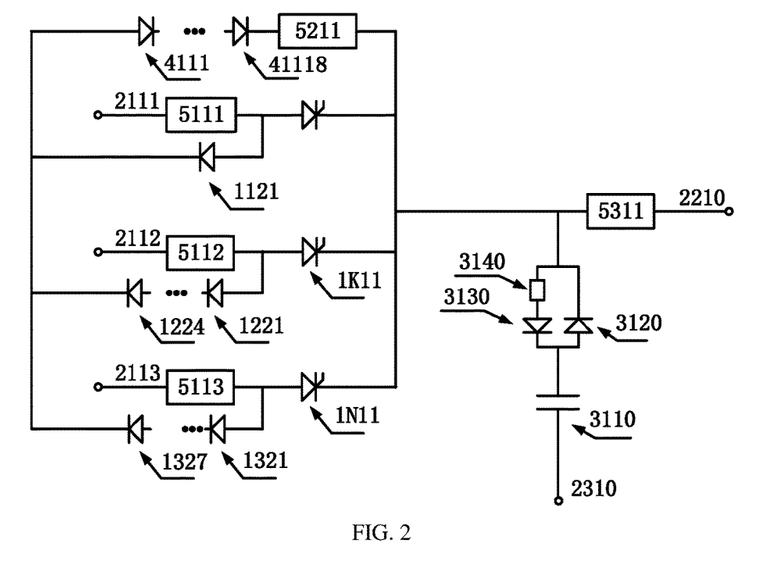
FIG. 2 is a schematic diagram of the electrical topology of a low-voltage DC power distribution fast switching device that can be connected to three-way common negative power supplies in an embodiment of the present disclosure.

In order to describe the technical solution of the present disclosure in more detail, the specific embodiment of the present disclosure also provides a low-voltage DC power distribution fast switching device that can be connected to three-way common negative power supplies. FIG. 2 is a schematic diagram of the electrical topology of the low-voltage DC power distribution fast switching device that can be connected to the three-way common negative power supplies in the embodiment of the present disclosure. In this embodiment, the rated voltages of the three-way power supplies A, B, and C are all 375V, and the normal operating range is 350V to 375V. Constant voltage control is adopted, and the voltage ripple is within 1% of the rated voltage. The priorities of the three-way power supplies A, B, and C are arranged in order from high to low. The line impedances from the power supplies A, B, and C to the device of the present disclosure are all 0.01 ohm. The load is a resistive load, and the equivalent resistance is 0.24 ohm. It is required that the quick switch can avoid the voltage sag of 1 ms without switching the power supply.

Setting U1=25V, U2=4V, $I_1$=50 A, the device of the present disclosure is designed as follows.

Diodes with a forward voltage drop of 1.4V and a rated current of 1500 A are selected to compose a common diode cluster, and a complementary diode cluster for the three-way switching circuits. The common diode cluster is composed of 18 diodes (diodes 4111 to 41118) connected in series, the supplementary diode cluster for the first switching circuit is composed of 1 diode (diode 1121), the supplementary diode cluster for the second switching circuit is composed of 4 diodes (diodes 1221 to 1224) connected in series, and the supplementary diode cluster for the third switching circuit is composed of 7 diodes (diode 1321 to 1327) connected in series. The rated current of the thyristors (1111, 1211, 1311) in the three switching circuits is 2000 A. The capacitance value of the delay capacitor 3110 is 0.1 F. The positive poles of the power supplies A, B, and C are respectively connected to the positive input terminals 2111, 2112, and 2113 of the three-way switching circuits of the present disclosure.

Figure 3:
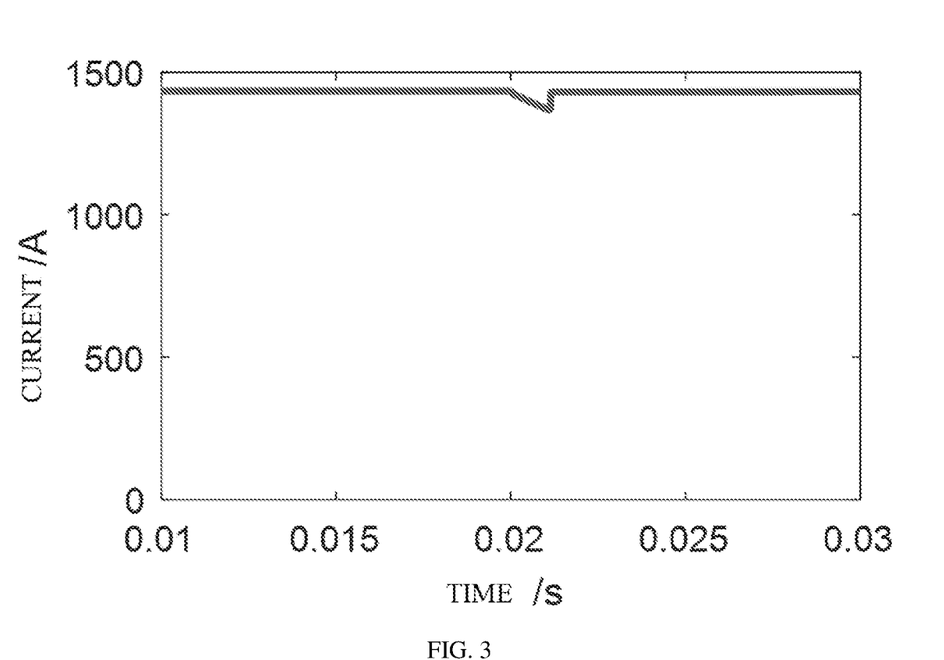
FIG. 3 is a time domain diagram of the output current in scenario 1 according to an embodiment of the present disclosure.
Figure 4:
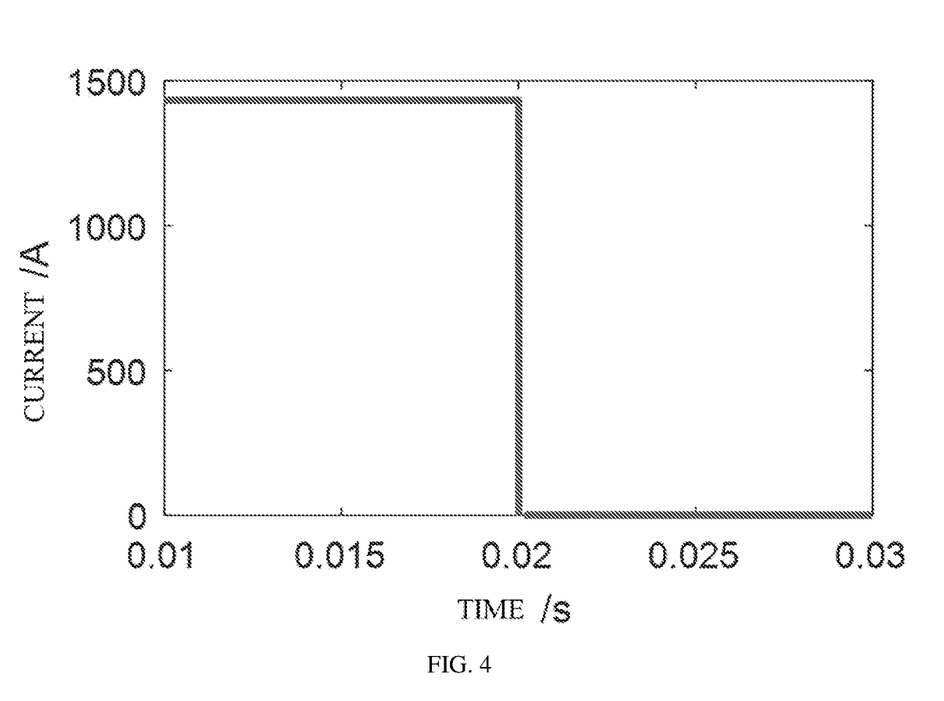
FIG. 4 is a time domain diagram of the output current of the power supply A in scenario 1 according to an embodiment of the present disclosure.
Figure 5:
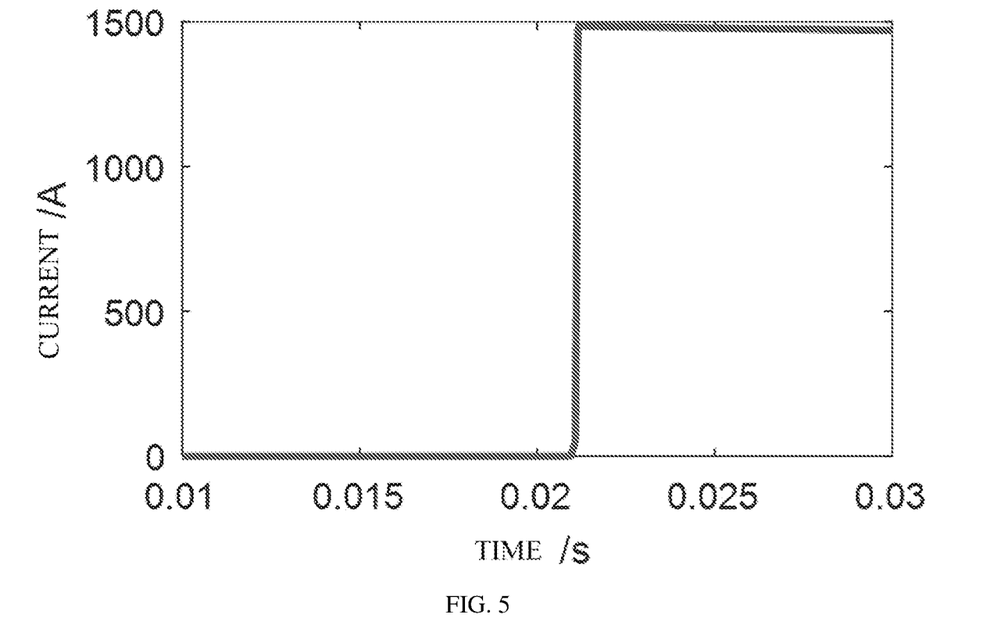
FIG. 5 is a time domain diagram of the output current of the power supply B in scenario 1 according to an embodiment of the present disclosure.
Figure 6:
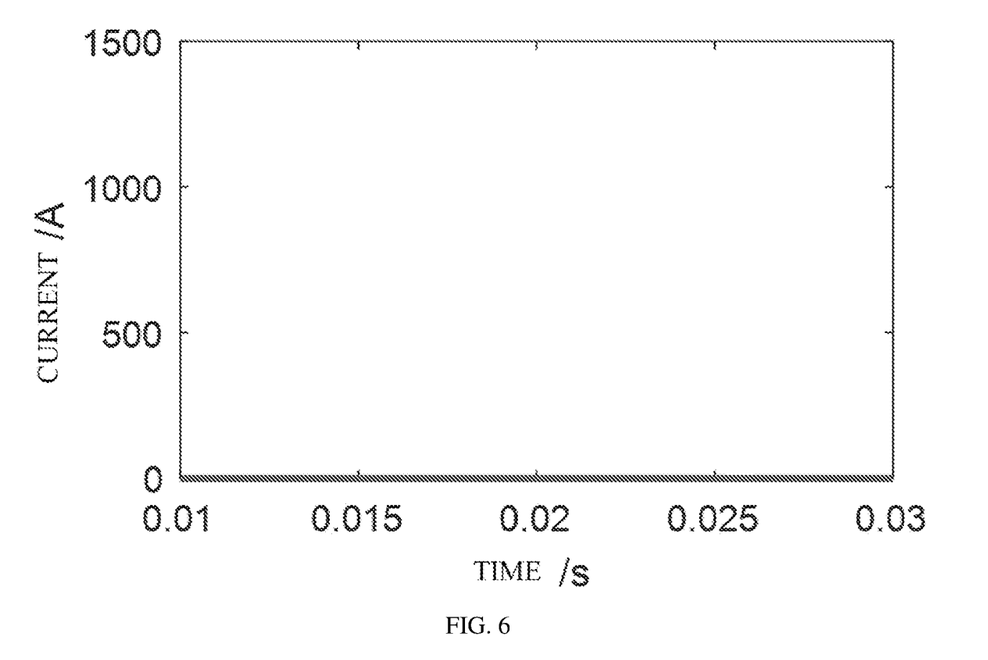
FIG. 6 is a time domain diagram of the output current of the power supply C in scenario 1 according to an embodiment of the present disclosure.

Scenario 1: The power supply A loses power at 0.02 s, and the load is powered by the power supply B. The time domain diagram of the output current of the device of the present disclosure is shown in FIG. 3, and the time domain diagrams of the output current of the power supplies A, B, and C are shown in FIG. 4, FIG. 5, and FIG. 6.

Figure 7:
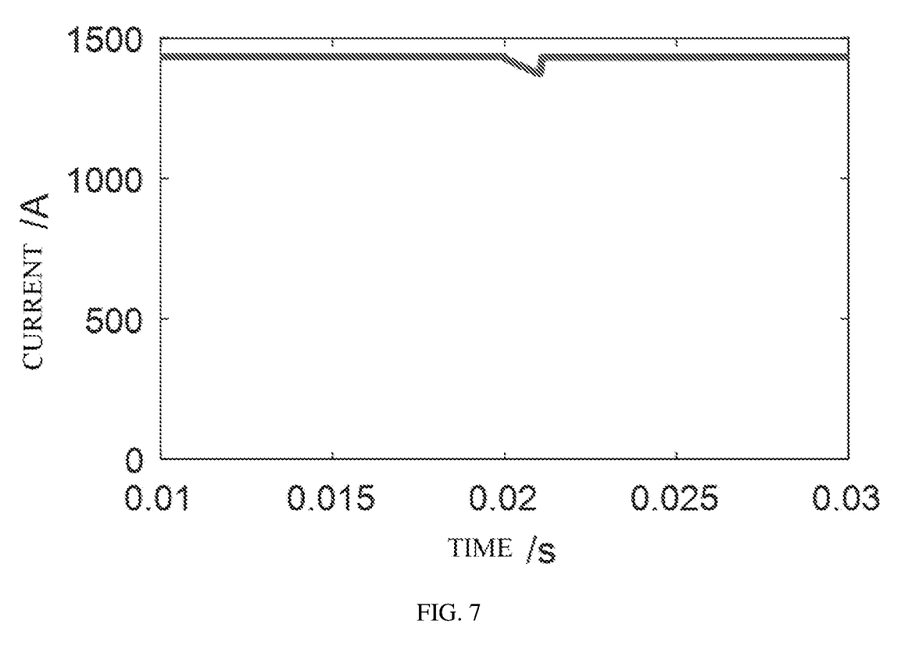
FIG. 7 is a time domain diagram of the output current in scenario 2 according to an embodiment of the present disclosure.
Figure 8:
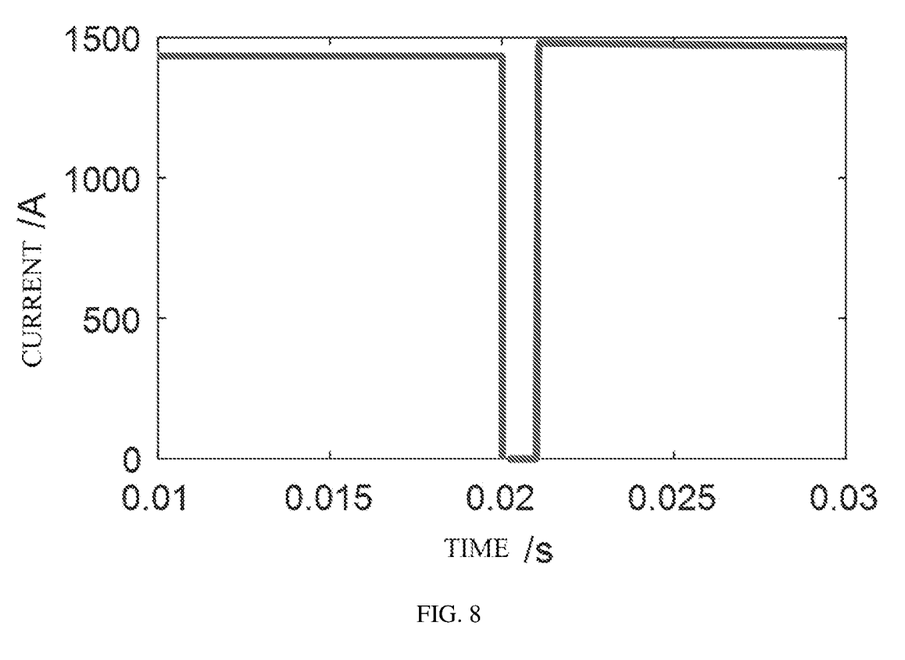
FIG. 8 is a time domain diagram of the output current of the power supply A in scenario 2 according to an embodiment of the present disclosure.
Figure 9:
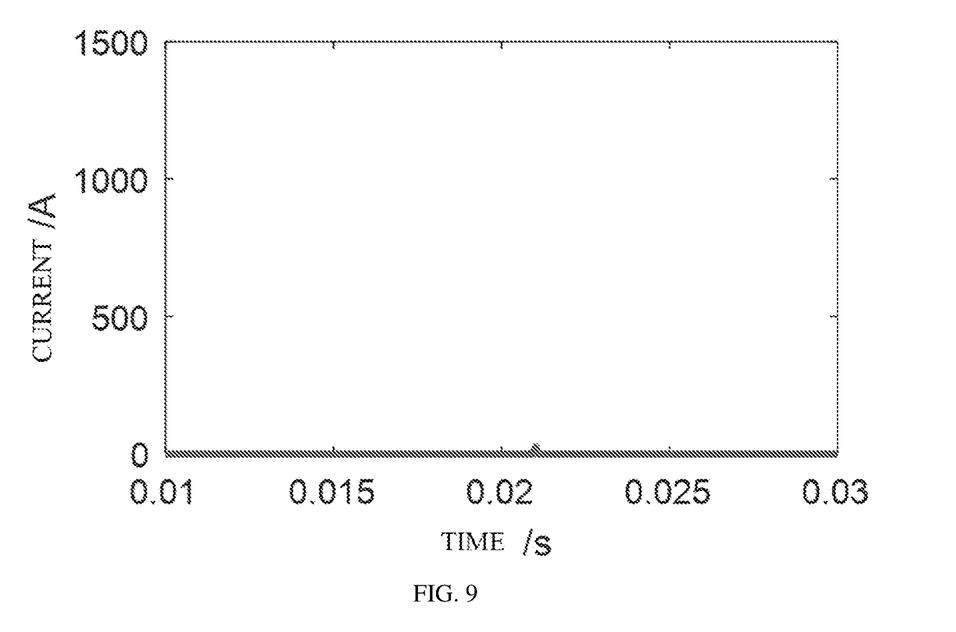
FIG. 9 is a time domain diagram of the output current of the power supply B in scenario 2 according to an embodiment of the present disclosure.
Figure 10:
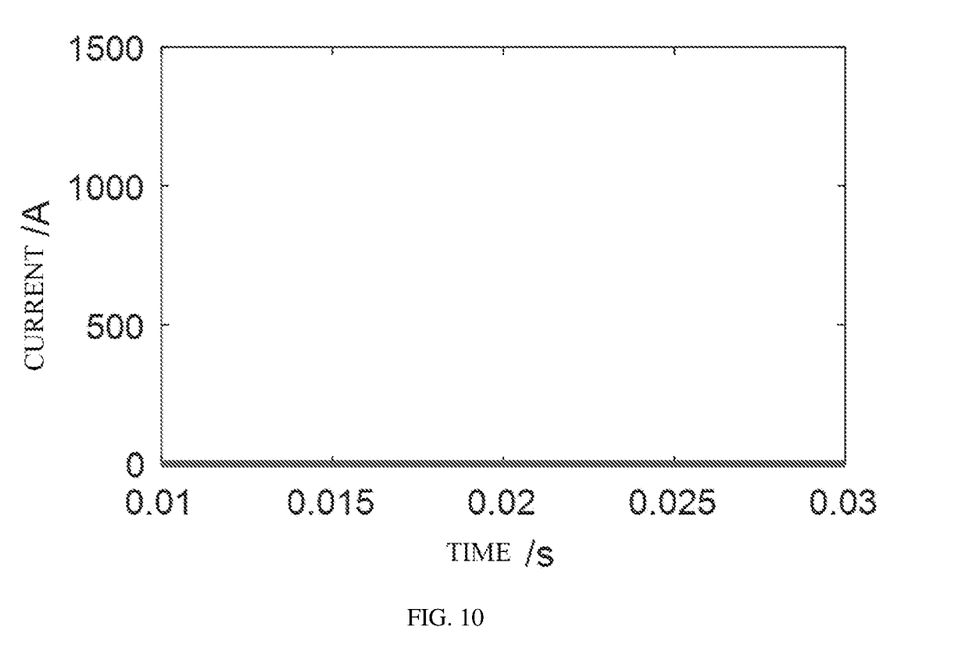
FIG. 10 is a time domain diagram of the output current of the power supply C in scenario 2 according to an embodiment of the present disclosure.

Scenario 2: The power supply A has a voltage sag of 1 ms at 0.02 s, and the load is still powered by the power supply B. The time domain diagram of the output current of the device of the present disclosure is shown in FIG. 7, and the time domain diagrams of the output current of the power supplies A, B, and C are shown in FIG. 8, FIG. 9, and FIG. 10.

Figure 11:
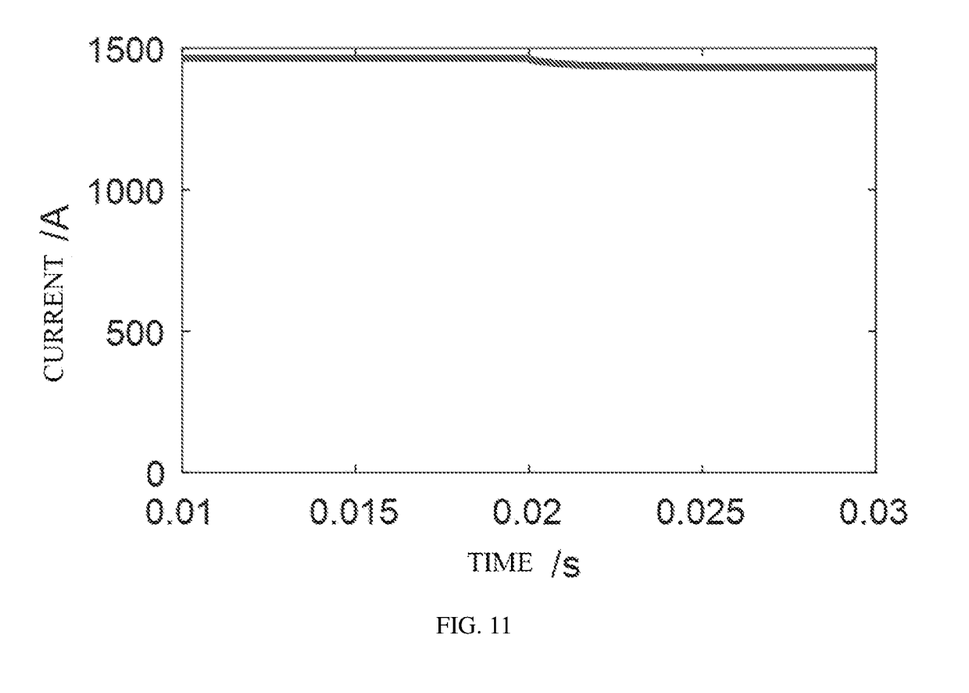
FIG. 11 is a time domain diagram of the output current in scenario 3 according to an embodiment of the present disclosure.
Figure 12:
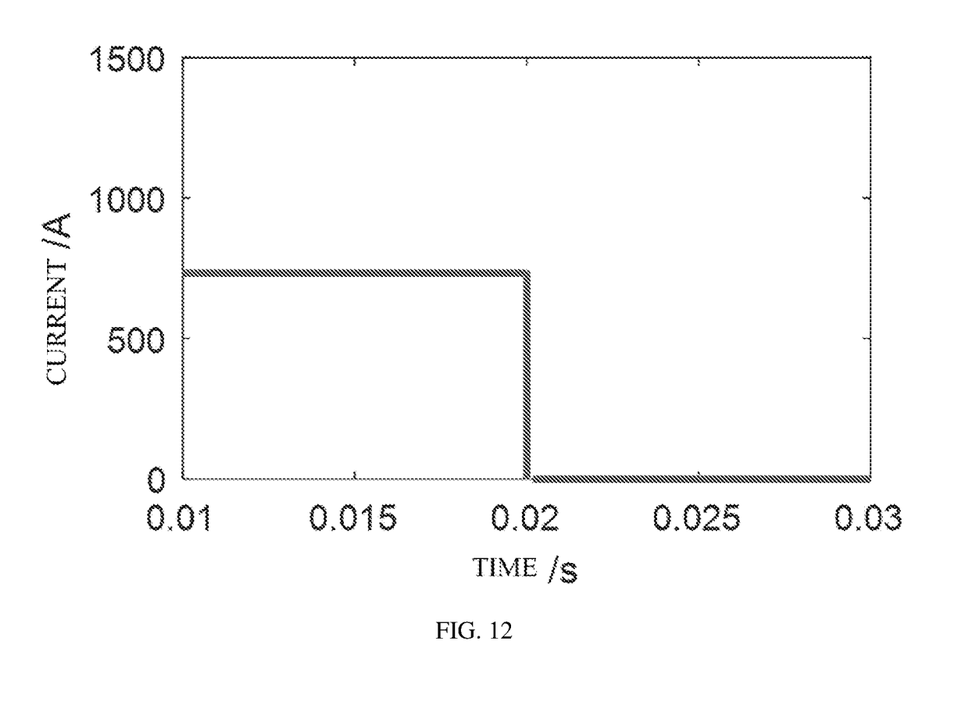
FIG. 12 is a time domain diagram of the output current of the power supply A in scenario 3 according to an embodiment of the present disclosure.
Figure 13:
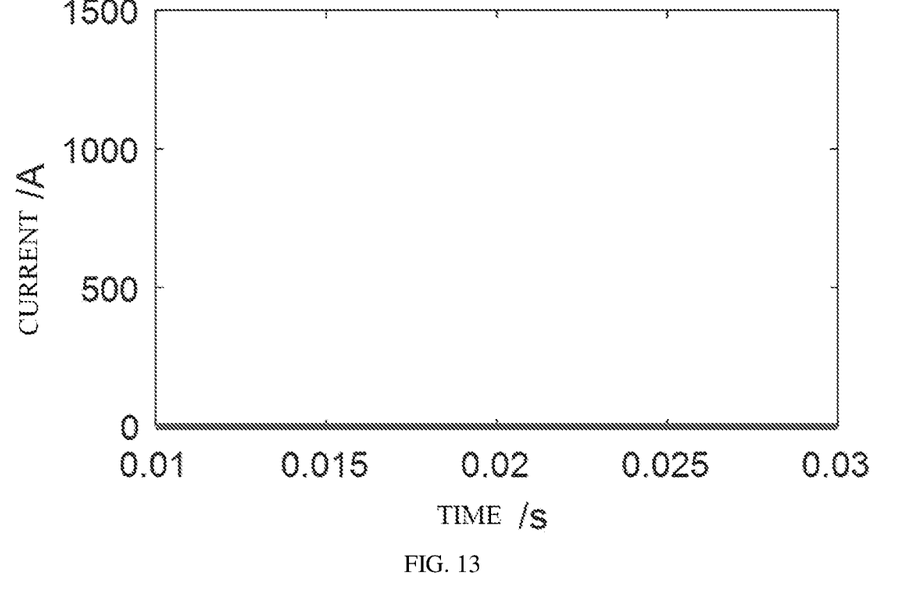
FIG. 13 is a time domain diagram of the output current of the power supply B in scenario 3 according to an embodiment of the present disclosure.
Figure 14:
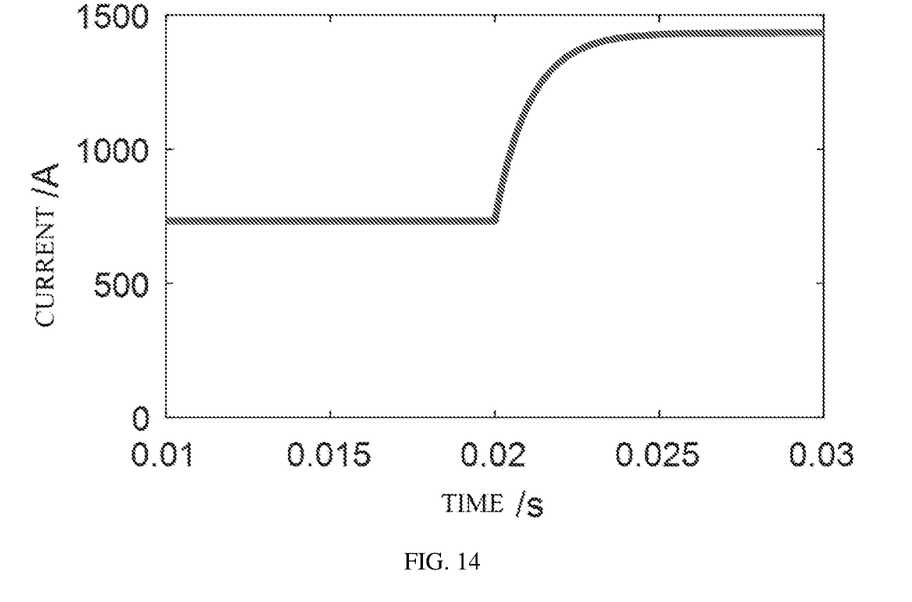
FIG. 14 is a time domain diagram of the output current of the power supply C in scenario 3 according to the embodiment of the present disclosure.

Scenario 3: The power supply A loses power at 0.02 s, the control system loses its control ability due to the fault, and the load is powered by the power supply B and the power supply C. The time domain diagram of the output current of the device of the present disclosure is shown in FIG. 11, and the time domain diagrams of the output current of the power supplies A, B, and C are shown in FIG. 12, FIG. 13, and FIG. 14.

It can be seen that the device of the present disclosure can achieve the established design requirements and ensure the continuous and stable power supply of the load.

In summary, the device of the present disclosure can achieve the following technical effects.

1) The load voltage is clamped by the forward voltage drop of both the supplementary diode cluster and the common diode cluster. Compared with the spare power automatic switching device and the fast switching device using only controllable components, the device of the present disclosure is not dependent on the control system, and can implement uninterrupted automatic switching of power supplies without intervention of the control system and provide reliable power supply for the load.

2) By limiting the turn-on voltage of the common diode cluster, it is possible to prevent mis-switching caused by changes in the voltage operating point.

3) The circuit design of the supplementary diode cluster in parallel with the thyristors is adopted. As the power supply is automatically switched without relying on control, the equipment can maintain a relatively high efficiency by controlling the on and off of the thyristor to reduce the on-state loss of the device.

4) The circuit design of sharing a common diode cluster saves (N−1)×Y power diodes compared with the scheme of separately configuring the N-way switching circuits. Under the premise of realizing the same function, the device cost is greatly reduced.

5) The circuit design of arranging the supplementary diode cluster in the switching circuit is adopted. Without relying on the control system, it provides priority for the connected N-way power supplies and provides a reliable switching function with priority.

6) The circuit design of connecting the delay capacitor between the output terminal of the switching circuit and the common negative terminal is adopted. In this way, the device has the ability to withstand malfunctions under the voltage droop without intervention of the control system, and enhance the reliability of the device.

7) The circuit design of connecting the charging diode in series with the resistance and in inverse-parallel with the diode between the output terminal of the switching circuit and the delay capacitor is adopted. While suppressing the charging current of the delay capacitor at the moment when the thyristor is turned on during the power switching process, it does not affect the delay function of delay capacitor.

The above are only preferred embodiments of the present disclosure. It should be noted that for those of ordinary skill in the art, without departing from the technical principles of the present disclosure, several improvements and modifications can be made. These improvements and modifications should also be regarded as within the protection scope of the present disclosure.

The invention claimed is:

1. A low-voltage DC power distribution fast switching device, comprising a positive output terminal electrically coupled to a positive pole of a load, and no less than two switching circuits coupled in parallel with each other; the switching circuit comprises a positive input terminal electrically coupled to a positive pole of common negative power supplies, a single supplementary diode or a supplementary diode cluster composed of no less than two diodes connected in series, and a thyristor coupled between the positive input terminal and the positive output terminal; the positive input terminal is electrically coupled to an anode of the single supplementary diode or an anode of the supplementary diode cluster, the positive input terminal is electrically coupled to an anode of the thyristor, the positive output terminal is electrically coupled to a cathode of the single supplementary diode or a cathode of the complementary diode cluster, and the positive output terminal is electrically coupled to a cathode of the thyristor.

2. The low-voltage DC power distribution fast switching device of claim 1, wherein the switching circuit further comprises a current sensor connected in series with the single supplementary diode or the supplementary diode cluster.

3. The low-voltage DC power distribution fast switching device of claim 1, wherein the device further comprises a single common diode or a common diode cluster composed of no less than two diodes connected in series; an anode of the single common diode or an anode of the common diode cluster is electrically connected to the cathodes of the single supplementary diodes or the supplementary diode clusters of all switching circuits, and a cathode of the single common diode or a cathode of the common diode cluster is electrically connected to the positive output terminal.

4. The low-voltage DC power distribution fast switching device of claim 3, wherein the single common diode or the common diode cluster is connected in series with a current sensor.

5. The low-voltage DC power distribution fast switching device of claim 1, wherein the device further comprises a common negative terminal electrically connected to a negative pole of the common negative power supplies and a negative pole of the load, and the common negative terminal is electrically connected to the positive output terminal through a delay circuit.

6. The low-voltage DC power distribution fast switching device of claim 5, wherein the delay circuit comprises a delay capacitor, a negative pole of the delay capacitor is electrically connected to the common negative terminal, and a positive pole of the delay capacitor is electrically connected to the positive output terminal.

7. The low-voltage DC power distribution fast switching device of claim 6, wherein the delay circuit further comprises a discharging diode as well as a charging resistor and a charging diode connected in parallel with the discharging diode electrically connected between the positive pole of the delay capacitor and the positive output terminal; the charging resistor is connected in series with the charging diode, a cathode of the charging diode and an anode of the discharging diode are electrically connected to the positive pole of the delay capacitor, an anode of the charging diode is electrically connected to the positive output terminal through the charging resistor, and a cathode of the discharging diode is electrically connected to the positive output terminal.

8. The low-voltage DC power distribution fast switching device of claim 1, wherein a forward voltage drop of the single supplementary diode or the complementary diode cluster is inversely proportional to a power supply priority of the common negative power supply connected to the switching circuit where the complementary diode cluster is located.

9. The low-voltage DC power distribution fast switching device of claim 1, wherein the common negative power supplies are low-voltage DC power supplies having a common negative pole.

* * * * *